United States Patent [19]
Koyanagi

[11] Patent Number: 5,402,018
[45] Date of Patent: Mar. 28, 1995

[54] SEMICONDUCTOR INTEGRATED CIRCUIT

[75] Inventor: Masaru Koyanagi, Yokohama, Japan

[73] Assignee: Kabushiki Kaisha Toshiba, Kawasaki, Japan

[21] Appl. No.: 107,143

[22] Filed: Aug. 17, 1993

[30] Foreign Application Priority Data

Aug. 21, 1992 [JP] Japan .................. 4-222686

[51] Int. Cl.6 .............. H03K 19/08; H03K 19/20; H05B 37/02
[52] U.S. Cl. ..................... 327/23; 307/115; 307/18; 307/29; 307/25; 307/32; 307/38; 327/3; 327/565; 326/112
[58] Field of Search .............. 307/241, 115, 596, 514, 307/18, 29, 25, 32, 34, 38, 52

[56] References Cited

U.S. PATENT DOCUMENTS

| 3,560,939 | 2/1971 | Lukács | 307/241 |
| 4,084,105 | 4/1978 | Taranishi et al. | 307/241 |
| 4,348,616 | 9/1982 | Tanaka et al. | 307/38 |

FOREIGN PATENT DOCUMENTS

| 0283186 | 9/1988 | European Pat. Off. |
| 2600453 | 12/1987 | France. |
| 2120427 | 11/1983 | United Kingdom. |

Primary Examiner—William L. Sikes
Assistant Examiner—Fetsum Abraham
Attorney, Agent, or Firm—Foley & Lardner

[57] ABSTRACT

A semiconductor integrated circuit is operative in a plurality of different modes. A plurality of select signals whose number corresponds to modes selected from a plurality of different modes are outputted. In response to the select signals, it is detected whether at least two operation modes are selected simultaneously. If so, a detection signal is outputted. In response to this detection signal, the operation of the semiconductor integrated circuit is stopped. Further, in response to the select signal, the semiconductor integrated circuit is activated in a mode by means of a predetermined select signal of these select signals. Further, in response to these select signals, the selected mode can be detected.

19 Claims, 7 Drawing Sheets

SEMICONDUCTOR INTEGRATED CIRCUIT

BACKGROUND OF THE INVENTION

1. Field of the Invention

The present invention relates to a semiconductor integrated circuit provided with bonding pads or fuses for switching an internal circuit to any desired mode of a plurality of previously set operation modes.

2. Description of the Prior Art

Recently, semiconductor integrated circuits (referred to as ICs, hereinafter) having bonding pads or fuses for switching the internal circuit have been developed in order to realize a plurality of modes by a single chip. FIG. 1 is a plane view showing an IC and bonding pads as described above. In FIG. 1, bonding pads 121 to 140 formed on a chip 100 disposed in a lead frame are electrically connected to respective pins 101 to 120 of the lead frame via wires 141 to 160. Here, the pin 101 is a voltage supply pin, and the pads 161 to 163 are those for switching the operation modes of the circuit. Therefore, it is possible to set any desired operation mode by connecting the voltage supply pin 101 to any one of the switching pads 161, 162 and 163.

FIG. 2 is a circuit diagram showing an example of the operation switching circuit provided in an IC in order to switch the IC operation modes. The operation switching circuit 1 is composed of high resistance N channel transistors Ta, Tb and Tc; and inverters 6a1 and 6a2, 6b1 and 6b2, and 6c1 and 6c2. Operation mode switching pads Pa, Pb and Pc are connected to the input terminals of the corresponding inverters 6a1, 6b1 and 6c1 via nodes 4a, 4b and 4c, respectively. Further, the output terminals of the inverters 6a1, 6b1 and 6c1 are connected to the input terminals of the inverters 6a2, 6b2 and 6c2, respectively.

The drains of the transistors Ta, Tb and Tc are connected to the nodes 4a, 4b and 4c, respectively; the sources of the same transistors are connected to a predetermined supply voltage, respectively; and a supply voltage Vcc is applied to the gates thereof, respectively. The pads Pa, Pb and Pc are ordinarily held at the ground potential by the transistors Ta, Tb and Tc, respectively. The potentials at these pads are transmitted to nodes 8a, 8b and 8c via corresponding two-stage inverters 6, respectively. The nodes 8a, 8b and 8c are connected to additional operation circuits 70a, 70b and 70c, respectively. These additional operation circuits are connected to a basic circuit 80 via nodes 75a, 75b and 75c, respectively.

The additional operation circuits 70a, 70b and 70c are formed in the IC so as to function in different operation modes, respectively. As described in more detail later, whenever any one of the additional operation circuits 70 is selected, it is possible to activate the IC in any desired mode in cooperation with the selected additional operation circuit 70 and the basic circuit 80 including any other essential circuits (e.g., a clock oscillator, etc.).

In operation, when the potentials at the nodes 4a, 4b and 4c are at the ground level, the additional operation circuits 70 connected to the corresponding nodes are deactivated, so that the basic circuit 80 is not subjected to the influence of the additional operation circuits 70.

Here, when the supply voltage Vcc is given to the pad Pa via a wire connection, for instance, since the resistance of the transistor Ta is high, the potential at the node 4a rises to the supply voltage Vcc. This potential at the node 4a is transmitted to the node 8a via the inverters 6a1 and 6a2 to activate the additional operation circuit 70a. Accordingly, the basic circuit 80 is affected by the additional operation circuit 70a, thus any desired operation mode of the IC being selectable.

In the prior art semiconductor integrated circuit as described above, however, since the respective additional operation circuits 70a, 70b and 70c are provided so as to function in complementary operation modes, when the supply voltage is erroneously applied to two or more pads of the three pads Pa, Pb and Pc simultaneously, the additional operation circuits 70 corresponding to these pads P are activated simultaneously and thereby the basic circuit 80 is affected by these additional operation circuits 70, with the result that it is impossible to obtain any desired characteristics. Where this status occurs during the manufacturing process, the product is determined to be defective. Further, this status cannot be detected by the ordinary test according to the combinations of the plural operation modes selected. In other words, since abnormal operation occurs only in a specific combination, there exists a problem in that the reliability of the IC is deteriorated or an accident may occur.

As described above, in the prior art semiconductor integrated circuit provided with bonding pads or fuses for selecting or switching the operation modes of the circuit, since the circuits corresponding to the respective plural operation modes are often independent from each other, although erroneous bonding can be detected at specific operation timings, the ordinary test cannot detect the erroneous bonding, thus raising a problem in that manufacturing control is difficult to perform.

SUMMARY OF THE INVENTION

With these problems in mind therefore, it is the object of the present invention to provide a semiconductor integrated circuit provided with bonding pads for selecting or switching a plurality of operation modes, which can allow erroneous bonding to be detected easily and therefore removed from the manufacturing process.

Further, the other object of the present invention is to provide a semiconductor integrated circuit which can be operated in any selected operation mode, in case the operation mode has been selected erroneously.

To achieve the above-mentioned objects, the present invention provides a semiconductor integrated circuit operative in a plurality of different modes, which comprises: means for outputting the number of select signals whose number corresponds to modes selected from a plurality of the different modes; means, responsive to the select signal, for detecting whether at least two operation modes are selected simultaneously and outputting a detect signal; and means, responsive to the detect signal, for stopping operation of the semiconductor integrated circuit.

Further, the present invention provides a semiconductor integrated circuit operative in a plurality of different modes, which comprises: means for outputting the number of select signals whose number corresponds to modes selected from a plurality of the different modes; and means responsive to the number of the select signals, for activating the semiconductor integrated circuit in a mode by means of a predetermined select signal of the select signals.

Further, the present invention provides a semiconductor integrated circuit operative in a plurality of different modes, which comprises: means for outputting the number of select signals whose number corresponds to modes selected from a plurality of the different modes; and means, responsive to the number of the select signals, for detecting which mode is selected.

According to the semiconductor integrated circuit of the present invention constructed as described above, the detecting means detects whether two or more operation modes are selected simultaneously. In case two or more operation modes are selected simultaneously, the predetermined operation (the selected operation, the output operation, etc.) is stopped by the operation stopping means. Therefore, it is possible to easily detect the bonding error produced when a plurality of operation modes are selected or switched, and further to remove the defective IC from the manufacturing process.

Further, in the semiconductor integrated circuit of the present invention as described above, when two or more operation modes are selected, only one operation mode is selected and activated by the circuit operating means. Accordingly, even if the operation modes are selected or switched in error, it is possible to use the semiconductor integrated circuit in the operation mode erroneously selected and switched.

Furthermore, in the semiconductor integrated circuit of the present invention as described above, the detecting means can detect which operation mode is now selected on the basis of the output of the select signal outputting means. Therefore, it is possible to easily detect the bonding error produced when a plurality of operation modes are selected or switched, and further to remove the defective IC from the manufacturing process.

DETAILED DESCRIPTION OF THE PREFERRED EMBODIMENTS

Figure 2:
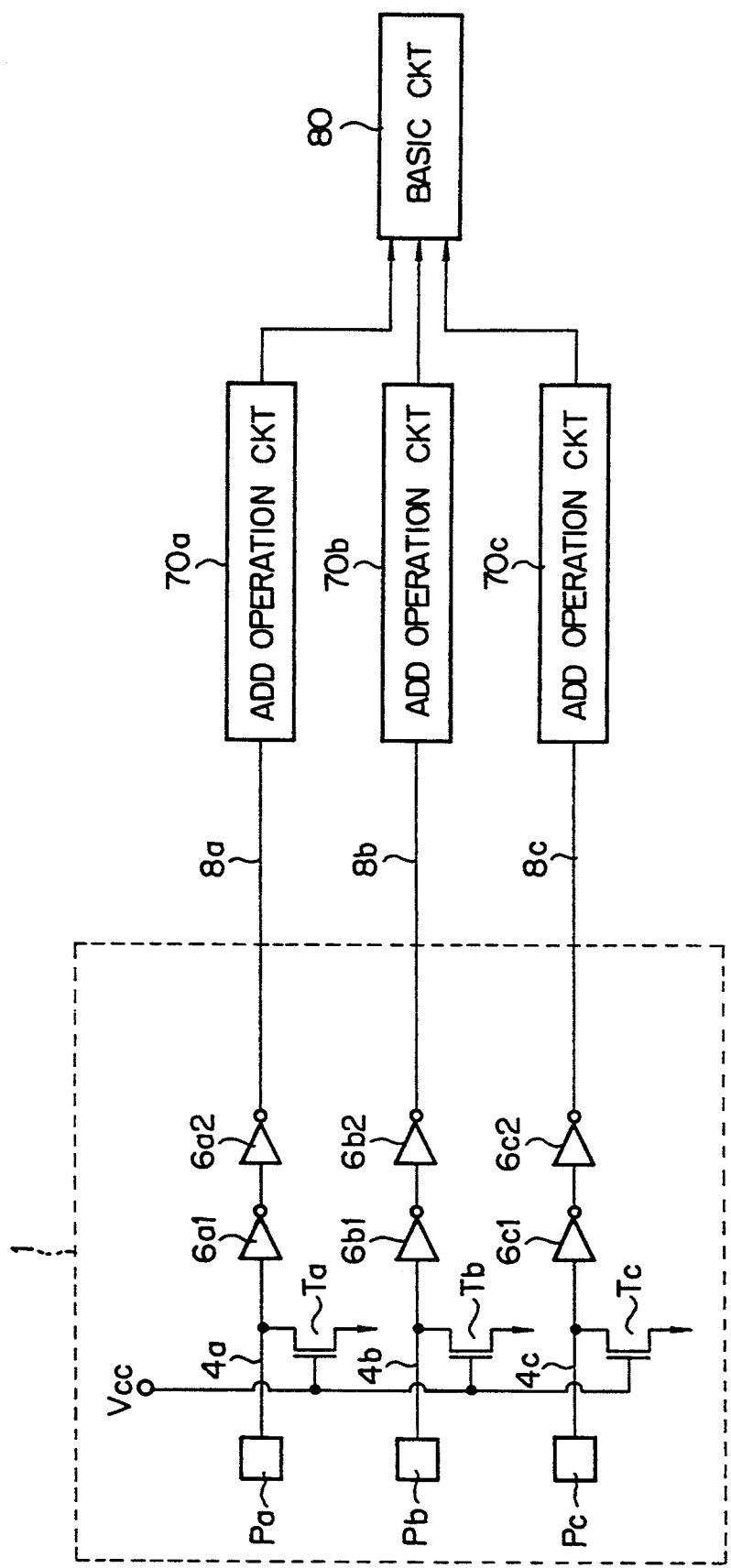
FIG. 2 is a block diagram showing a prior art semiconductor integrated circuit.

A first embodiment of the semiconductor integrated circuit according to the present invention will be described hereinbelow with reference to FIG. 3. In this first embodiment, an logic circuit 20 and an operation stop circuit 30 for stopping the IC operation are additionally provided to the prior art circuit as shown in FIG. 2. The logic circuit 20 is composed of four NAND gates 21a, 21b, 21c and 23. Two inputs of the NAND gate 21a are connected to the outputs of the inverters 6a2 and 6b2 of the operation switching circuit 1, respectively. Two inputs of the NAND gate 21b are connected to the outputs of the inverters 6b2 and 6c2 of the operation switching circuit 1, respectively. Further, two inputs of the NAND gate 21c are connected to the outputs of the inverters 6a2 and 6c2 of the operation switching circuit 1, respectively. Three outputs of the respective NAND gates 21a, 21b and 21c are connected to the inputs of the NAND gate 23.

When the pads Pa and Pb are both connected to the supply voltage Vcc through a wire connection, for instance, the outputs of the inverters 6a2 and 6b2 change to a HIGH level, so that the output of the NAND gate 21a changes to a LOW level. Similarly, when the pads Pb and Pc or further pads Pa and Pc are both connected to the supply voltage Vcc, the output of the NAND gate 21b or 21c changes to a LOW level.

The output of the NAND gate 23 is connected to the operation stop circuit 30, and the output of this operation stop circuit 30 is further connected to the basic circuit 80. The operation stop circuit 30 is in inoperative status or deactivated when the output of the NAND gate 23 is at the LOW level, but in operative status or activated when at the HIGH level. Here, when two or more pads of the three pads Pa, Pb and Pc are connected to the supply voltage Vcc by mistake, two or more circuits of the additional operation circuits 70a, 70b and 70c (whose multi-selection is inhibited) are selected. Then, at least one of the outputs of the NAND gates 21a, 21b and 21c changes to the LOW level, so that the output of the NAND gate 23 changes to the HIGH level. Accordingly, the operation stop circuit 30 is activated to securely stop the predetermined circuit operation of the basic circuit 80 (e.g., the operation of the multi-selected circuits, the output operation of the IC circuit, etc.). In other words, it is possible to detect a bonding miss produced during the wiring connection for selecting or switching the operation modes.

Figure 4:
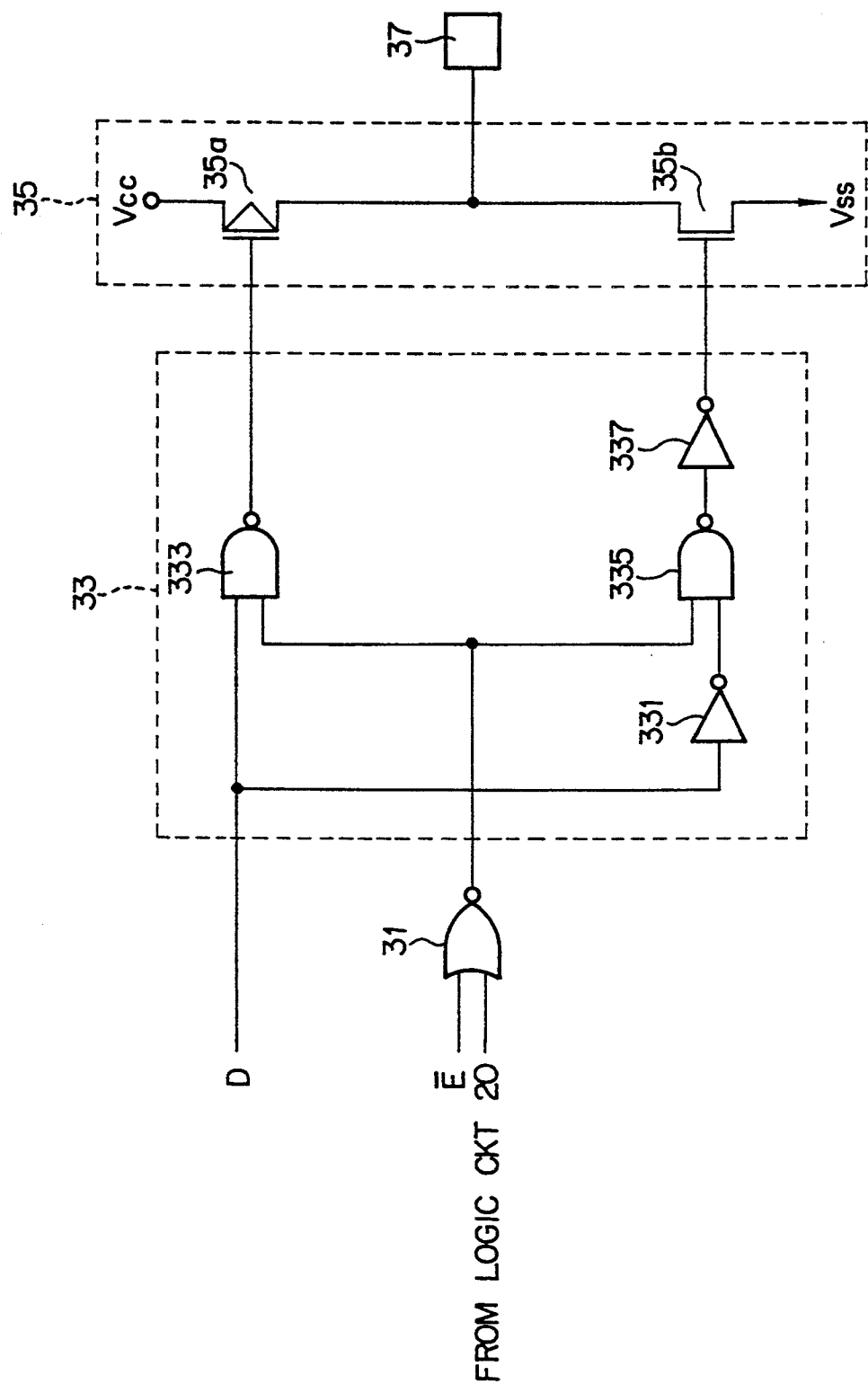
FIG. 4 is a block diagram showing a practical example of the operation stop circuit shown in FIG. 3.

FIG. 4 shows an example of the operation stop circuit 30, which is composed of a NOR gate 31, an output switching circuit 33, and an output circuit 35. Further, the output switching circuit 33 is composed of an inverter 331, two NAND gates 333 and 335, and an inverter 337. The output circuit 35 is composed of a P channel transistor 35a and an N channel transistor 35b.

Figure 3:
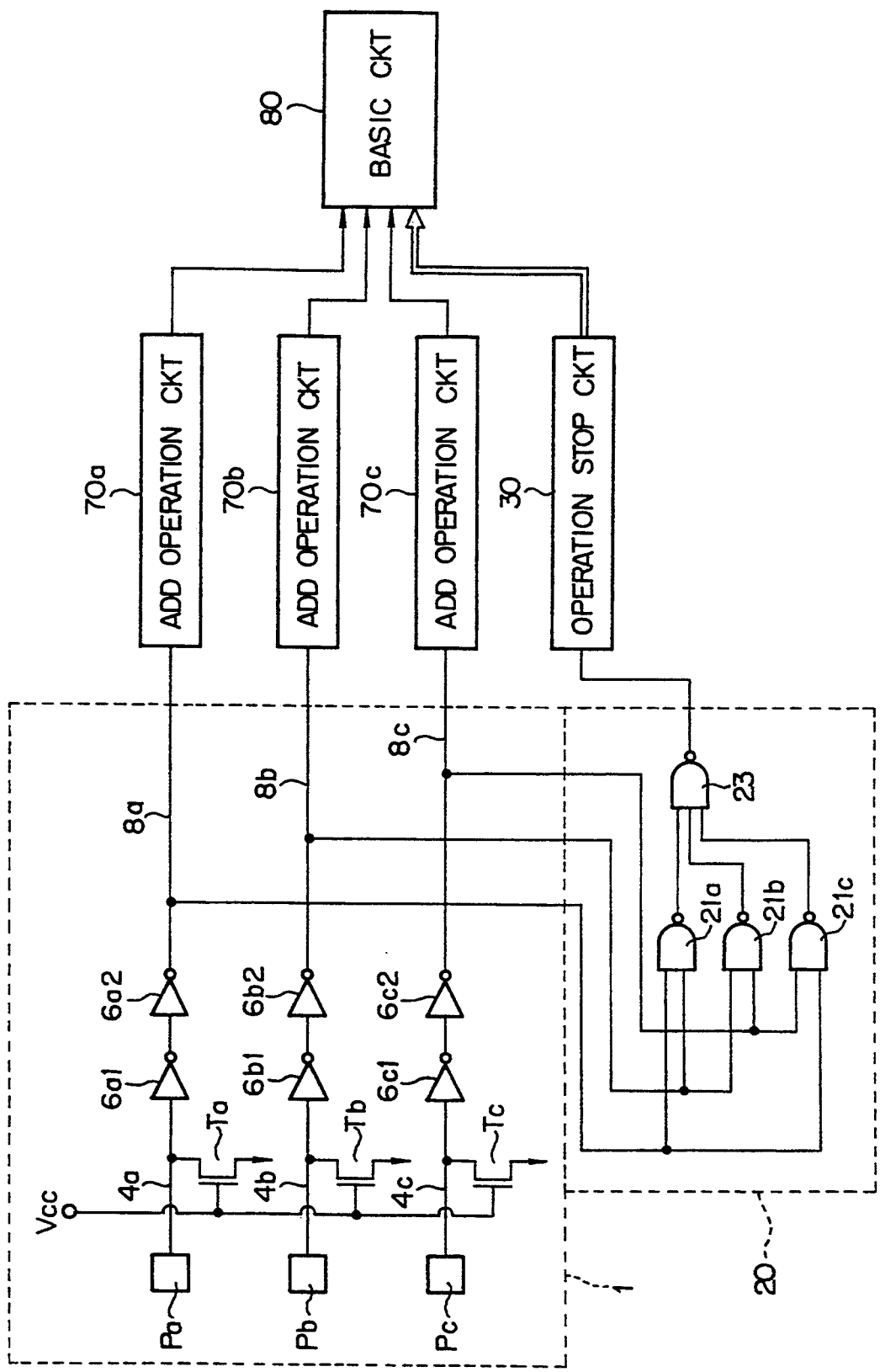
FIG. 3 is a block diagram showing a first embodiment of the present invention.

Data D written in the IC is given to the input of the NAND gate 333 of the output switching circuit 33 from the basic circuit 80 shown in FIG. 3. Further, an enable signal E for reading the data D and the output of the logic circuit 20 shown in FIG. 3 are given to the NOR gate 31 from the basic circuit 80 shown in FIG. 3. Therefore, when the enable signal E changes from the HIGH level to the LOW level, the output of the NOR gate 31 changes from the LOW level to the HIGH level, and then this HIGH level is given to the NAND gates 333 and 335 of the output switching circuit 33.

When the data D is at the HIGH level, this data is given to the NAND gate 333 directly and the NAND gate 335 via the inverter 331, so that the output of the NAND gate 333 changes to the LOW level and the NAND gate 335 changes to the HIGH level. Further, the output of the NAND gate 335 changes to the LOW level via the inverter 337.

The output signals of the NAND gate 333 and the inverter 337 are given to the gates of the P channel transistor 35a and the N channel transistor 35b, respectively. As shown in FIG. 4, since the P channel transistor 35a is connected to the supply voltage Vcc and the N channel transistor 35b is connected to the ground potential Vss, respectively, when the LOW level output signal is applied from the NAND gate 333 to the gate of the P channel transistor 35a and the LOW level output signal is applied from the inverter 337 to the gate of the N channel transistor 35b, the HIGH level signal is outputted from the output circuit 35 and further applied to the basic circuit 80 shown in FIG. 3 via the output pad 37. In contrast with this, when the data D is at the LOW level, the LOW level signal is applied from the output circuit 35 to the basic circuit 80 via the output pad 37.

In the case where any one of the additional operation circuits shown in FIG. 3 is selected, since the output of the logic circuit 20 is at the LOW level, the operation stop circuit 30 is not activated in response to this LOW level. However, in case two or more additional operation circuits are multi-selected due to erroneous connection, since the output of the logic circuit 20 changes to the HIGH level, the output of the NOR gate 31 shown in FIG. 4 is fixed to the LOW level.

Accordingly, even if the enable signal E changes from the HIGH level to the LOW level, the output switching circuit 33 is not operative, so that no potential develops at the output pad 37. Therefore, the basic circuit 80 is inoperative, with the result that the output operation of the IC circuit stops, for instance.

In addition to the operation stop circuit 30 shown in FIG. 4, various operation stop circuits 30 operative only in the case of the multi-selection can be considered, for instance as follows: a HIGH or LOW level signal is always outputted from the output pad 37; the internal circuit operation of the IC is stopped perfectly; the data writing operation to the IC is disabled; a specific pin (clock pin) is fixed to the HIGH or LOW level; the circuit operation is disabled only in a specific operation mode; a part of the circuit operation is stopped to disable the normal operation; etc.

Figure 5:
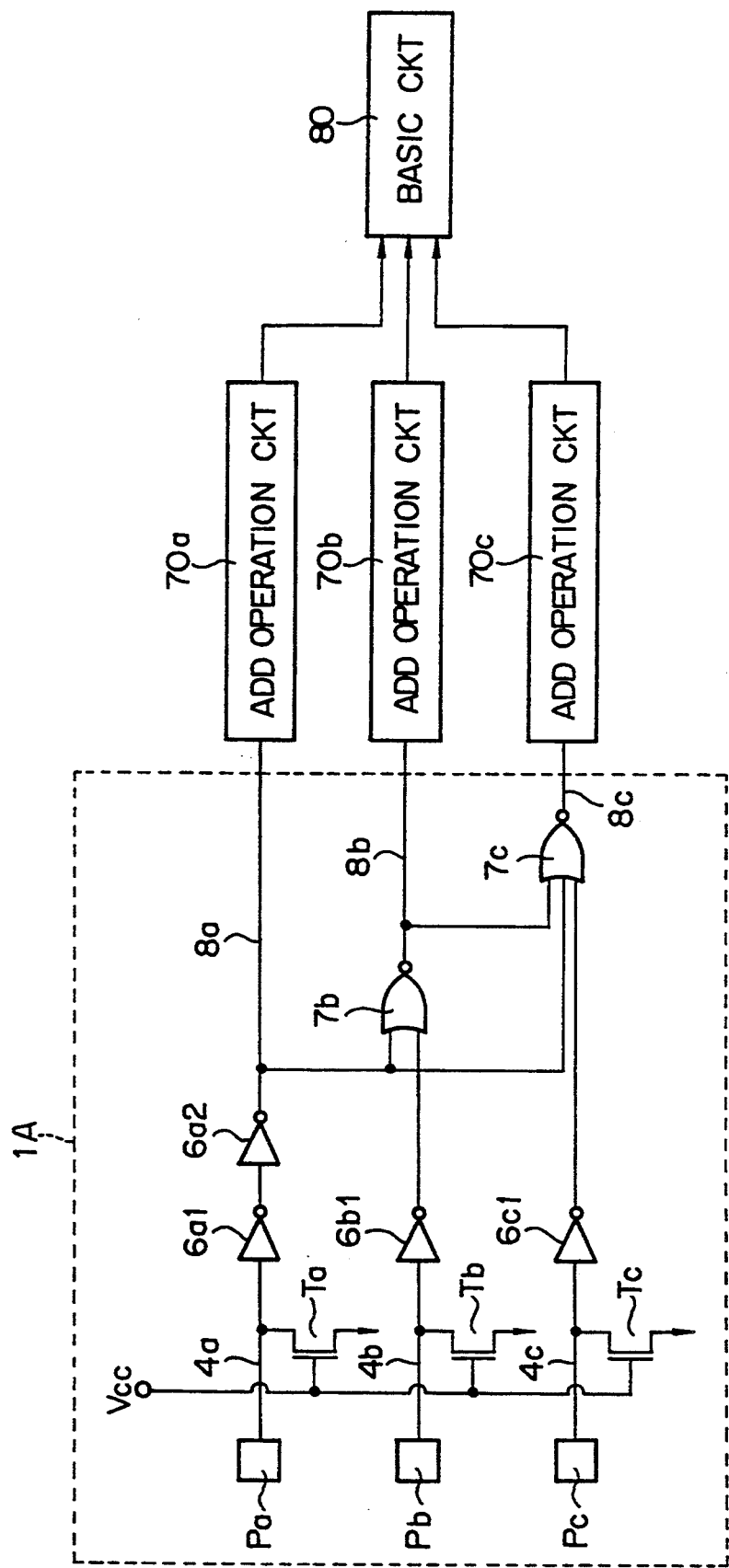
FIG. 5 is a block diagram showing a second embodiment of the present invention.

A second embodiment of the semiconductor integrated circuit according to the present invention will be described hereinbelow with reference to FIG. 5. In this second embodiment, an operation switching circuit 1A is provided, instead of the operation switching circuit 1, in the prior art semiconductor integrated circuit shown in FIG. 2. In this operation switching circuit 1A, the inverter 6b2 of the operation switching circuit 1 shown in FIG. 2 is replaced with a NOR gate 7b, and the inverter 6c2 thereof is replaced with a NOR gate 7c. The NOR gate 7b is operative in response to the output of the inverter 6a2 and the output of the inverter 6b1, and further the output of the NOR gate 7b is transmitted to the additional operation circuit 70b via the node 8b. On the other hand, the NOR gate 7c is operative in response to the output of the NOR gate 7b, the output of the inverter 6a2, and the output of the inverter 6c1, and further the output of the NOR gate 7c is transmitted to the additional operation circuit 70c via the node 8c.

In this second embodiment, in case at least two of the additional operation circuits 70a, 70b and 70c are multi-selected in bonding error, the priority order of the circuits allowed to be operative is determined.

For instance, when both the pads Pa and Pb are connected to the supply voltage Vcc in error, the nodes 4a and 4b are both at the HIGH level. Therefore, the output of the inverter 6a2 changes to the HIGH level and the output of the NOR gate 7b changes to the LOW level, so that only the additional operation circuit 70a is activated without activating the additional operation circuit 70b.

In the same way, when the pads Pb and Pc are selected simultaneously, only the additional operation circuit 70b is activated. When the pads Pa, Pb and Pc are all selected, only the additional operation circuit 70a is activated. Accordingly, the priority order of the additional operation circuits 70a, 70b and 70c is in the order of the additional operation circuits 70a, 70b and 70c.

As described above, when only one of the complementary modes is selected and thereby the corresponding additional operation circuit 70 is activated in accordance with the priority order as with the case of the second embodiment, even if the mode switching is set erroneously due to erroneous wire connection, it is possible to ship or sale the IC as a product operative only in the erroneously selected operation mode.

Figure 6:
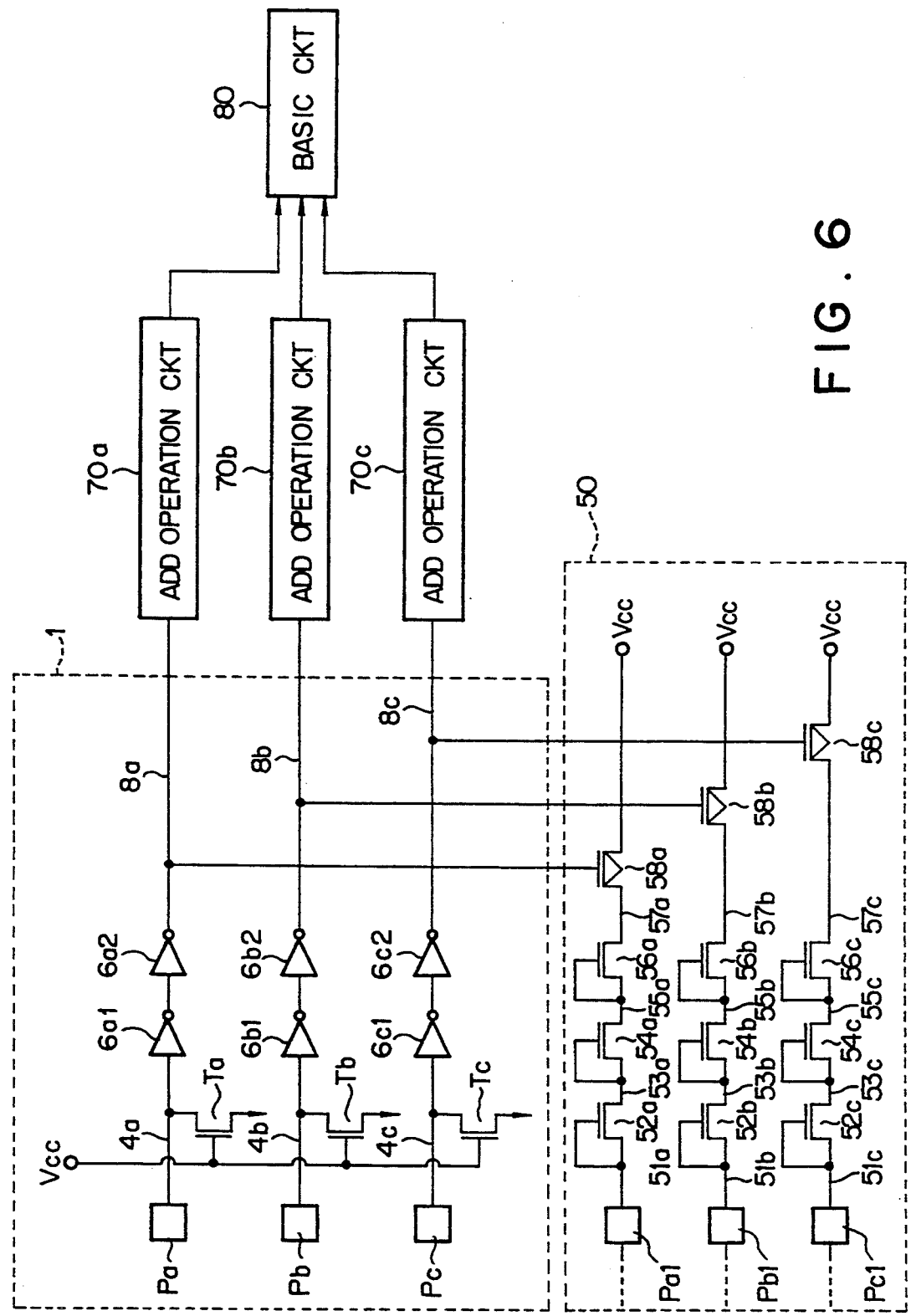
FIG. 6 is a block diagram showing a third embodiment of the present invention.

A third embodiment of the semiconductor integrated circuit according to the present invention will be described hereinbelow with reference to FIG. 6. In this embodiment, a detecting circuit 50 is additionally provided for the prior art semiconductor integrated circuit shown in FIG. 2. This detecting circuit 50 is composed of pads Pa1, Pb1, and Pc1; N channel transistors 52a, 52b and 52c, 54a, 54b and 54c, and 56a, 56b and 56c; and P channel transistors 58a, 58b and 58c.

The pads Pa1, Pb1 and Pc1 are connected to one ends (the sources) of the N channel transistors 52a, 52b and 52c via nodes 51a, 51b and 51c, respectively. The other ends (the drains) of the N channel transistors 52a, 52b and 52c are connected to one ends (the sources) of the N channel transistors 54a, 54b and 54c via nodes 53a, 53b and 53c, respectively. The other ends (the drains) of the N channel transistors 54a, 54b and 54c are connected to one ends (the sources) of the N channel transistors 56a, 56b and 56c via nodes 55a, 55b and 55c, respectively. The other ends (the drains) of the transistors 56a, 56b and 56c are connected to a supply voltage Vcc via the P channel transistors 58a, 58b and 58c, respectively.

Figure 1:
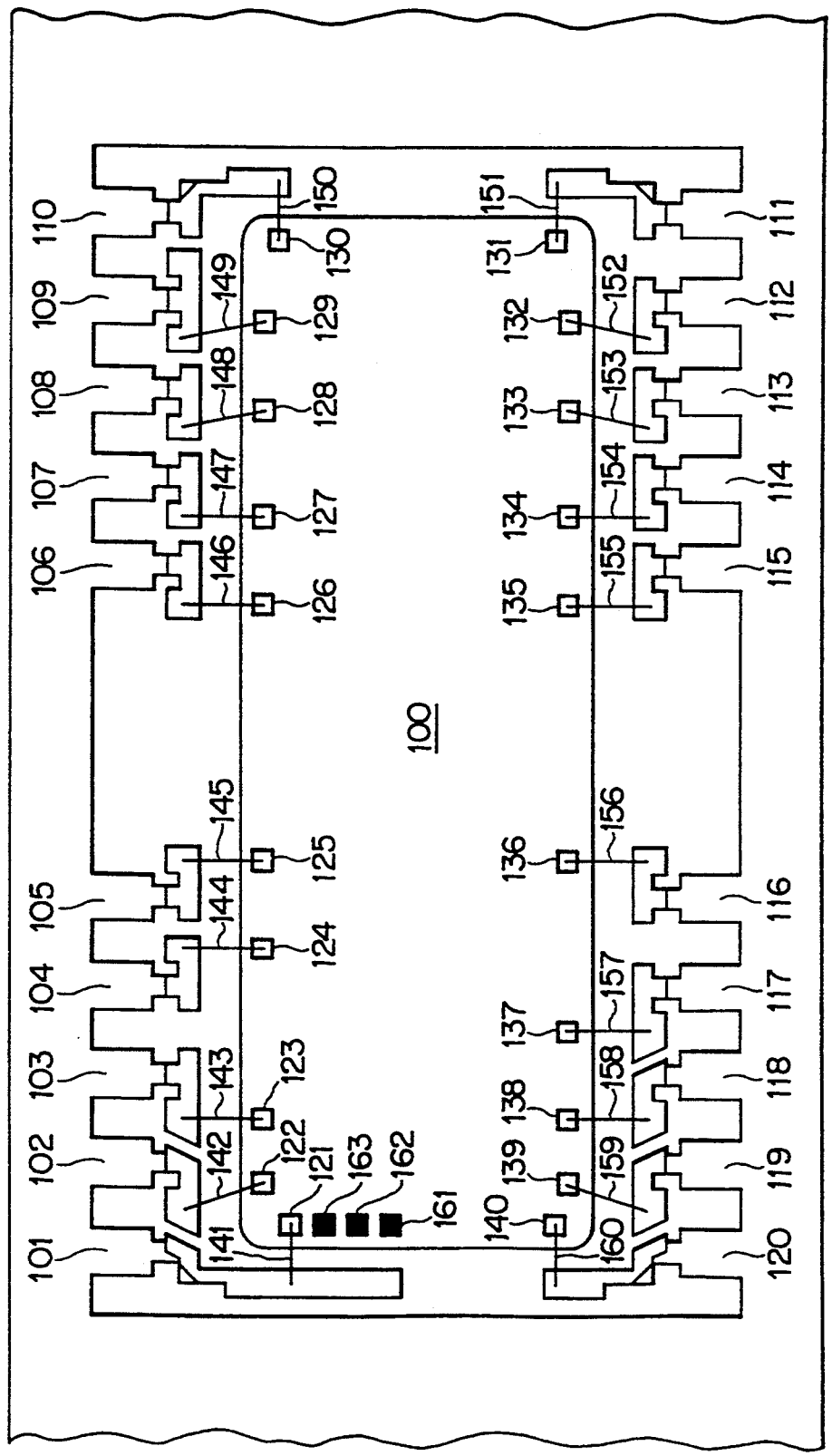
FIG. 1 is a plane view showing a semiconductor integrated circuit provided with bonding pads for switching circuit operation modes.

Further, the gates of the transistors 52a, 52b and 52c are connected to the nodes 51a, 51b and 51c, respectively; the gates of the transistors 54a, 54b and 54c are connected to the nodes 53a, 53b and 53c, respectively; and the gates of the transistors 56a, 56b and 56c are connected to the nodes 55a, 55b and 55c, respectively. Further, the outputs of the inverters 6a2, 6b2 and 6c2 of the operation switching circuit 1 are applied to the gates of the P channel transistors 58a, 58b and 58c, respectively. Further, the pads Pa1, Pb1 and Pc1 (which correspond to the pads 122 to 139 shown in FIG. 1) are connected to external pins of a package of the semiconductor integrated circuit.

This detecting circuit 50 can electrically detect the selected operation mode via the pads Pa1, Pb1 and Pc1, after the IC has been sealed into a package.

Here, the assumption is made that only the pad Pa is connected to the supply voltage Vcc and thereby only the additional operation circuit 70a is activated. In this case, since the output of the inverter 6a2 is at the HIGH level, the gate of the P channel transistor 58a of the detecting circuit 50 is at the HIGH level and the gates of the other P channel transistors 58b and 58c are at the LOW level. Under these conditions, a voltage higher than a predetermined voltage (supply voltage $Vcc + 3 \times Vth$, where Vth denotes the threshold voltage of the transistors 52a, 54a and 56a) is applied to the pads Pa1, Pb1 and Pc1 from an external supply voltage (not shown), and additionally the current flowing through the respective pads Pa1, Pb1 and Pc1 are monitored with an appropriate measuring instrument (not shown).

In this case, since the output of the inverter 6a2 is at the HIGH level and thereby the transistor 58a is turned off, almost no current flows through the pad Pa1. On the other hand, since the outputs of the inverters 6b2 and 6c2 are at the LOW level and thereby the transistors 58b and 58c are both turned on, the supply voltage Vcc is applied to the nodes 57b and 57c, respectively, so that current flows through the pads Pb1 and Pc2, respectively. Accordingly, it is possible to detect that the operation mode of the additional operation circuit 70a has been selected.

As described above, in the semiconductor integrated circuit of the third embodiment, it is possible to easily detect the selected operation mode electrically, even after the circuit has been sealed into a package. In addition, in case a plurality of operation modes have been selected erroneously, it is possible to detect the selected operation mode electrically by applying a voltage to the corresponding pads (Pa1, Pb1 and Pc1). Further, where the detecting circuit 50 is provided for the semiconductor integrated circuit of the second embodiment as shown in FIG. 5, in order to apply the outputs 8a, 8b and 8c of the operation switching circuit 1A to the gates of the transistors 58a, 58b and 58c of the detecting circuit 50, respectively, it is possible to detect the operation mode finally decided in the circuit shown in FIG. 5, by applying a voltage to the pads (Pa1, Pb1 and Pc1) and further monitoring the current values flowing through the pads, respectively.

Figure 7:
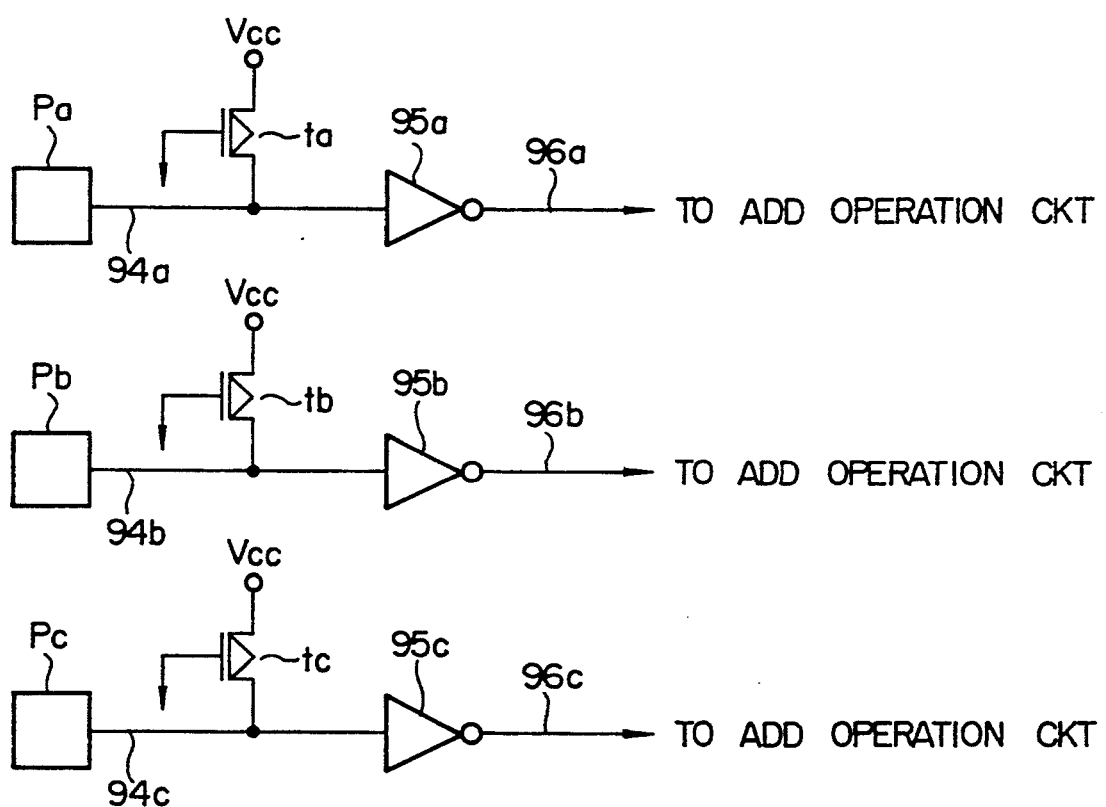
FIG. 7 is a block diagram showing another example of the operation switching circuit.

Further, in the above-mentioned embodiments, although the operation switching circuit 1 as shown in FIG. 2 has been applied to the semiconductor integrated circuit, without being limited thereto, however, it is possible to apply the operation switching circuit as shown in FIG. 7 to the semiconductor integrated circuit according to the present invention. In this circuit shown in FIG. 7, before the operation mode is selected, the potentials at the pads Pa, Pb and Pc are reversed by three P channel transistors ta, tb and tc, respectively, as compared with those shown in FIG. 2. Further, when the operation mode is selected, the pad corresponding to the selected mode is grounded, in contrast with the case shown in FIG. 2. In this embodiment, therefore, it is possible to eliminate the one stage inverter, respectively, and thereby the matching characteristics between nodes 94a, 94b, 94c and nodes 96a, 96b, 96c can be maintained. Further, in the operation switching circuit, fuses can be used instead of the bonding pads, respectively.

What is claimed is:

1. A semiconductor integrated circuit operative in a plurality of different modes, the semiconductor integrated circuit comprising:
   a plurality of input terminals;
   a plurality of resistive devices each connected between a corresponding one of the input terminals and a reference terminal to which a reference potential of the semiconductor integrated circuit is applied;
   a plurality of logic circuits each connected to a corresponding one of the input terminals and the resistive devices, each logic circuit generating a mode selection signal corresponding to one of the different modes when a predetermined potential is applied to one of the logic circuits from a corresponding one of the input terminals, the semiconductor integrated circuit thereby operating in a mode corresponding to the mode selection signal, and wherein a resistance of each resistive device is high enough such that an application of the predetermined potential to the one of the input terminals causes a voltage level of the one of the input terminals to be higher than a threshold voltage of the one of the logic circuits;
   detecting means, connected to the plurality of logic circuits, for generating a mode stop signal when at least two mode selection signals are simultaneously generated; and
   operation stopping means, operating in response to the mode stop signal, for stopping the operation of the semiconductor integrated circuit.

2. The semiconductor integrated circuit of claim 1, wherein said detecting means comprises:
   a plurality of means for NANDing at least two select signals of a plurality of select signals; and
   means for NANDing output signals of a plurality of said NANDing means and for outputting a detect signal when at least two operation modes are selected simultaneously.

3. The semiconductor integrated circuit of claim 1, wherein said operation stopping means comprises gating means for applying signals required for predetermined operation of the semiconductor integrated circuit to a predetermined circuit in the semiconductor integrated circuit, said gating means stopping the gate function thereof in response to a detect signal.

4. The semiconductor integrated circuit of claim 1, wherein each input terminal comprises a bonding pad that is connectable to a power supply terminal with wiring.

5. The semiconductor integrated circuit of claim 1, wherein
   each resistive device comprises an N channel transistor having a drain connected to a corresponding one of the input terminals, a gate connected to a power supply terminal to which a power supply voltage is applied, and a source connected to the reference terminal to which the reference potential of a ground level is applied.

6. The semiconductor integrated circuit of claim 1, wherein
   each resistive device comprises a P channel transistor having a source connected to a corresponding one of the input terminals, a drain connected to the reference terminal to which the reference potential of a power supply level is applied, and a gate connected to a ground terminal.

7. The semiconductor integrated circuit of claim 1, wherein
   each logic circuit comprises an inverter connected between a corresponding one of the resistive devices and the detecting means.

8. A semiconductor integrated circuit operative in a plurality of different modes, the semiconductor integrated circuit comprising:
   a plurality of input terminals;
   a plurality of resistive devices each connected between a corresponding one of the input terminals and a reference terminal to which a reference potential of the semiconductor integrated circuit is applied;
   a plurality of logic circuits each connected to a corresponding one of the input terminals and the resistive devices, each logic circuit generating a mode selection signal corresponding to one of the different modes when a predetermined potential is applied to one of the logic circuits from a corresponding one of the input terminals, and wherein a resistance of each resistive device is high enough such that an application of the predetermined potential to the one of the input terminals causes a voltage level of the one of the input terminals to be higher than a threshold voltage of the one of the logic circuits; and mode selection means for selecting one mode selection signal when at least two mode selection signals are generated, the semiconductor integrated circuit thereby operating in a mode corresponding to the selected mode selection signal.

9. The semiconductor integrated circuit of claim 8, wherein each input terminal comprises a bonding pad that is connectable to a power supply terminal with wiring.

10. The semiconductor integrated circuit of claim 8, wherein each resistive device comprises an N channel transistor having a drain connected to a corresponding one of the input terminals, a gate connected to a power supply terminal to which a power supply voltage is applied, and a source connected to the reference terminal to which the reference potential of a ground level is applied.

11. The semiconductor integrated circuit of claim 8, wherein each resistive device comprises a P channel transistor having a source connected to a corresponding one of the input terminals, a drain connected to the reference terminal to which the reference potential of a power supply level is applied, and a gate connected to a ground terminal.

12. The semiconductor integrated circuit of claim 8, wherein each logic circuit comprises an inverter connected to a corresponding one of the resistive devices.

13. The semiconductor integrated circuit of claim 8, further comprising:

current generating means, operative in response to the mode selection signal, for generating a current corresponding to the mode selection signal; and at least one observation terminal connected to an output of the current generating means, a mode selection signal thereby being observable as a current at an observation terminal.

14. A semiconductor integrated circuit operative in a plurality of different modes, the semiconductor integrated circuit comprising:

a plurality of input terminals;

a plurality of resistive devices each connected between a corresponding one of the input terminals and a reference terminal to which a reference potential of the semiconductor integrated circuit is applied;

a plurality of logic circuits, an input of each logic circuit connected to a corresponding one of the input terminals and to a corresponding one of the resistive devices, each logic circuit generating a mode selection signal corresponding to one of the different modes when a predetermined potential is applied from a corresponding one of the input terminals, the semiconductor integrated circuit thereby operating in a mode corresponding to the mode selection signal, and wherein a resistance of each resistive device is high enough such that an application of the predetermined potential to one of the input terminals of one of the logic circuits causes a voltage level of the one of the input terminals to be higher than a threshold voltage of the one of the logic circuits;

current generating means, operative in response to the mode selection signal, for generating a current corresponding to the mode selection signal; and at least one observation terminal connected to the current generating means, the mode selection signal thereby being observable as a current at the observation terminal.

15. The semiconductor integrated circuit of claim 14, wherein each input terminal comprises a bonding pad that is connectable to a power supply terminal with wiring.

16. The semiconductor integrated circuit of claim 14, wherein each resistive device comprises an N channel transistor having a drain connected to a corresponding one of the input terminals, a gate connected to a power source terminal to which a power supply voltage is applied, and a source connected to the reference terminal to which the reference potential of a ground level is applied.

17. The semiconductor integrated circuit of claim 14, wherein each resistive device comprises a P channel transistor having a source connected to a corresponding one of the input terminals, a drain connected to the reference terminal to which the reference potential of a power supply level is applied, and a gate connected to a ground terminal.

18. The semiconductor integrated circuit of claim 14, wherein each logic circuit comprises at least an inverter connected to a corresponding one of the resistive devices.

19. The semiconductor integrated circuit of claim 14, wherein the current generating means comprises:

a plurality of P channel transistors each having a source, a gate connected to a corresponding one of the logic circuits, and a drain connected to a power supply terminal; and a plurality of transistor groups each having N channel transistors connected in series at drains and sources thereof, a gate and a source of each N channel transistor connected to each other, a drain of one end transistor of series-connected N channel transistors connected to the source of a corresponding one of the P channel transistors and a source of another end transistor of the series-connected N channel transistors connected to an observation terminal.

* * * * *